United States Patent
Lee et al.

(10) Patent No.: US 12,131,957 B2
(45) Date of Patent: Oct. 29, 2024

(54) MANUFACTURING PROCESS WITH ATOMIC LEVEL INSPECTION

(71) Applicant: Taiwan Semiconductor Manufacturing Co., Ltd., Hsinchu (TW)

(72) Inventors: I-Che Lee, Hsinchu (TW); Huai-Ying Huang, Jhonghe (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 569 days.

(21) Appl. No.: 17/199,879

(22) Filed: Mar. 12, 2021

(65) Prior Publication Data

US 2022/0238390 A1 Jul. 28, 2022

Related U.S. Application Data

(60) Provisional application No. 63/150,234, filed on Feb. 17, 2021, provisional application No. 63/142,562, filed on Jan. 28, 2021.

(51) Int. Cl.
*H01L 21/66* (2006.01)
*G01Q 60/40* (2010.01)
(Continued)

(52) U.S. Cl.
CPC ............ *H01L 22/12* (2013.01); *G01Q 60/40* (2013.01); *G06T 7/0004* (2013.01); *H01L 21/67253* (2013.01); *H01L 22/14* (2013.01); *G06T 2207/10061* (2013.01); *G06T 2207/30148* (2013.01)

(58) Field of Classification Search
CPC ......... H01L 22/12; H01L 22/14; H01L 22/20; H01L 22/10; H01L 21/67253; G01Q 60/40; G01Q 60/30; G01Q 30/04; G06T 7/0004; G06T 2207/10061; G06T 2207/30148
See application file for complete search history.

(56) References Cited

U.S. PATENT DOCUMENTS 6,532,428 B1  3/2003  Toprac
8,034,641 B2*  10/2011  Ko .......................... G01Q 60/30
                                                       438/18
(Continued)

FOREIGN PATENT DOCUMENTS

DE  102018009623 A1  6/2020
JP     2004014780 A  1/2004
(Continued)

*Primary Examiner* — Michael M Trinh
(74) *Attorney, Agent, or Firm* — Eschweiler & Potashnik, LLC

(57) ABSTRACT

Costs may be avoided and yields improved by applying scanning probe microscopy to substrates in the midst of an integrated circuit fabrication process sequence. Scanning probe microscopy may be used to provide conductance data. Conductance data may relate to device characteristics that are normally not available until the conclusion of device manufacturing. The substrates may be selectively treated to ameliorate a condition revealed by the data. Some substrates may be selectively discarded based on the data to avoid the expense of further processing. A process maintenance operation may be selectively carried out based on the data.

20 Claims, 7 Drawing Sheets

(51) Int. Cl.
     *G06T 7/00*          (2017.01)
     *H01L 21/67*      (2006.01)

(56) References Cited

U.S. PATENT DOCUMENTS

| | | | |
|---|---|---|---|
| 8,089,297 B2 * | 1/2012 | Xiao | H01L 22/12 |
| | | | 324/762.01 |
| 8,093,074 B2 * | 1/2012 | Chang | H01J 37/26 |
| | | | 257/E21.531 |
| 2011/0115012 A1 | 5/2011 | Jiang et al. | |
| 2011/0151597 A1 * | 6/2011 | Chang | H01J 37/26 |
| | | | 257/E21.531 |
| 2016/0276228 A1 * | 9/2016 | Bedell | B82Y 35/00 |
| 2017/0062180 A1 | 3/2017 | Budach et al. | |
| 2019/0064675 A1 * | 2/2019 | Yu | G03F 7/7065 |
| 2020/0096332 A1 * | 3/2020 | Hu | G01B 21/30 |
| 2020/0119091 A1 * | 4/2020 | Chuang | H10N 50/01 |

FOREIGN PATENT DOCUMENTS

| | | |
|---|---|---|
| JP | 2011243783 A | 12/2011 |
| TW | 200406814 A | 5/2004 |
| TW | 200532795 A | 10/2005 |
| TW | 200949971 A | 12/2009 |

\* cited by examiner

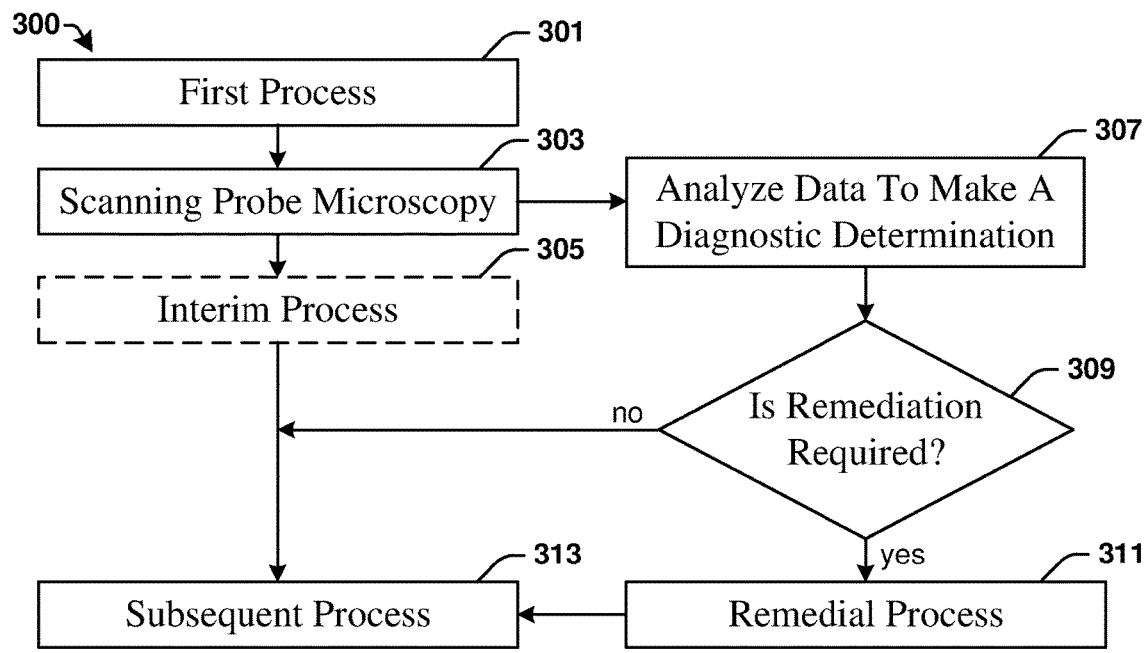
Fig. 3
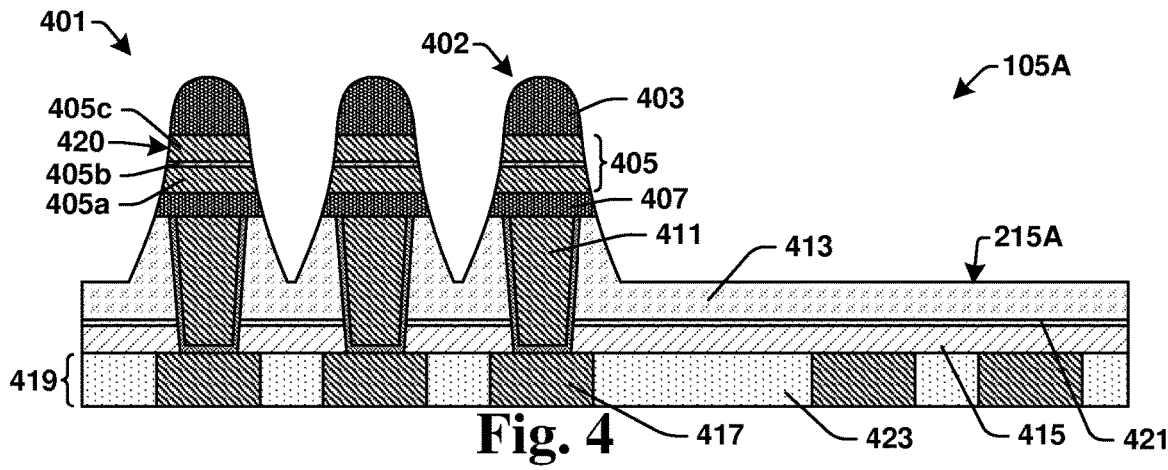
Fig. 4
Fig. 5

MANUFACTURING PROCESS WITH ATOMIC LEVEL INSPECTION

REFERENCE TO RELATED APPLICATIONS

This application claims the benefit of U.S. Provisional Application No. 63/142,562, filed on Jan. 28, 2021 and U.S. Provisional Application No. 63/150,234, filed on Feb. 17, 2021. The contents of the above-referenced patent applications are hereby incorporated by reference in their entirety.

BACKGROUND

Fabricating integrated circuits typically includes processing a substrate such as a semiconductor wafer through a large number of fabrication processes to form various features and devices. Substrates are put through hundreds of fabrication processes, which may include, but are not limited to, lithographic processes, plasma etching, wet etching, chemical vapor deposition (CVD), sputter deposition, chemical-mechanical polishing (CMP), ion implantation, annealing, variations thereof, and the like.

There is an ongoing demand for progressively higher device density. As a result, some fabrication processes may be operated close to the limits of their capabilities. Due to the high number of devices that are processed and the pushing of process limits, some fraction of the manufactured devices may be imperfect. To assure quality, manufacturers perform inspections on finished devices and discard those that fail to meet the manufacturer's standards. There is a cost associated with discarding devices and an ongoing need to reduce costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a flow chart of a method according to some aspects of the present teachings.

FIG. 4 illustrates a cross section of a memory device at an intermediate stage of manufacturing.

FIGS. 5-7 illustrates cross sections of the memory device of FIG. 4 at subsequent stage of manufacturing.

DETAILED DESCRIPTION

Figure 1:
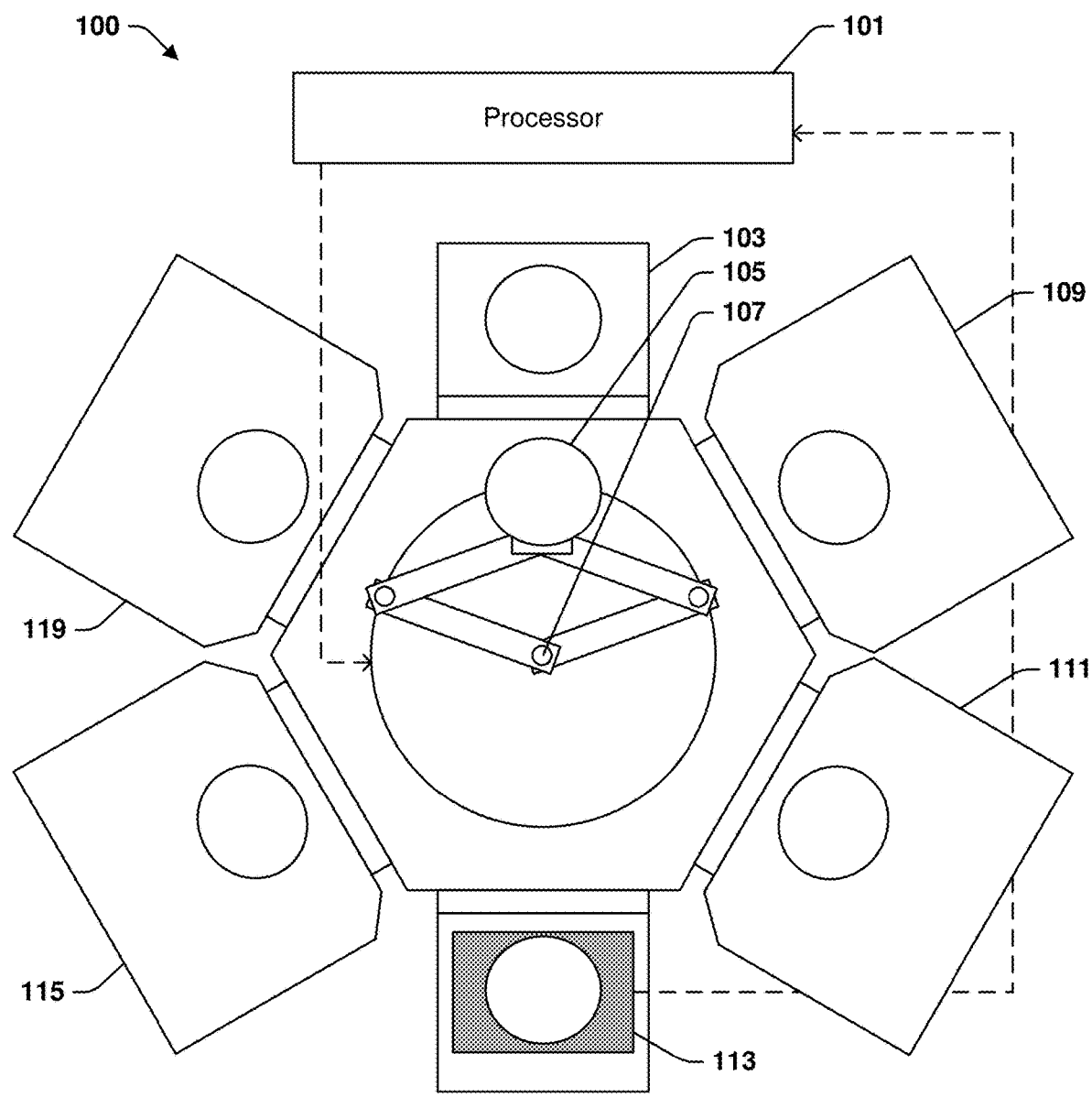
FIG. 1 illustrates a cross-sectional side view a manufacturing system according to some aspects of the present teachings.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Inspections are typically carried out at the conclusion of integrated circuit manufacturing to determine electrical characteristics such as write voltage, read voltage, current, and durability. There is a disadvantage, however, in that these inspections are time consuming and costly. According to the present teachings, costs may be avoided and yields improved by applying scanning probe microscopy to substrates in the midst of an integrated circuit fabrication process sequence. In some embodiments, substrates are selectively treated to ameliorate a condition detected by the microscopy. In some embodiments, substrates are selectively discarded to avoid the expense of further processing. In some embodiments, the scanning probe microscopy provides conductance data. The conductance data may relate to device characteristics that are normally not available until the conclusion of device manufacturing.

Some aspects of the present teachings relate to a method that includes applying a first manufacturing process to a substrate and then scanning a portion of the substrate surface with a scanning probe microscope to obtain data. The data is used to make a diagnostic determination on the basis of which a second manufacturing process is selectively either applied or not applied to the substrate. In some embodiments, the second manufacturing process is an ordinary part of the manufacturing sequence that is only carried out if the diagnostic determination established that the result of prior processing is satisfactory. In some embodiments, the second manufacturing process is a remedial process by which a condition reflected by the diagnostic determination may be ameliorated. In some embodiments, a third manufacturing process is applied while the data is being analyzed. Continuing processing in parallel with the data analysis may improve throughput.

In some embodiments, the scanning probe microscope comprises an atomic force microscope that collects topological (height) data. In some embodiments, the scanning probe microscope comprises a conductance atomic force microscope that collects conductance data. In some embodiments, the scanning probe microscope provides both topological data and conductance data. Conductance data may directly relate to electrical properties that are normally evaluated only after fabrication has been completed.

In some embodiments, the portion of the substrate surface that is scanned is only a fraction of the substrate surface. In some embodiments, a plurality of discrete areas of the substrate surface are included in the scan. Scanning a plurality of discrete areas may account for center to periphery variations and other variations that may occur systematically across a substrate surface. In some embodiments, a plurality of scanning probes are used to increase the scanning rate. In some embodiments, different sample areas are selected from one substrate to the next in order increase a probability of detecting a defect that could be systematically localized.

Making a diagnostic determination involves processing the data. In some embodiments, processing the data includes rendering the data as an image. In some embodiments where there is more than one type of data, the data is rendered as a plurality of images. In some embodiments, one image represents topological data and another image represents conductance data. The data may be filter, scaled, consolidated, or otherwise processed as it is rendered into one or more images.

In some embodiments, processing the data comprises identifying device images that correspond to individual instances of a device that has multiple instances across the image. In some embodiments, the device is a memory cell. In some embodiments, the device is a metal gate. In some embodiments, a diagnostic determination is made based on the data within the device images (grey-scale image data). In some embodiments, device shape data is extracted from the grey-scale image data and the diagnostic determination is made based on the shape data. In some embodiments, perimeters of the device images are identified and the diagnostic determination is made based on the shapes of the perimeters.

In some embodiments, the first process includes ion beam etching. In some embodiments, the first process includes a wash process that follows the ion beam etching and prepares the substrate for a subsequent deposition process. The diagnostic determination may establish whether conductive residues are present in amounts that could cause excessive shorting. In some embodiments, an additional etch or clean process is performed selectively based on the diagnostic determination.

In some embodiments, the first process is a spacer etch or the like. In some embodiments, the first process includes a wet clean that follows the spacer etch and prepares the substrate for a subsequent deposition process. In some embodiments, the spacer is a first spacer formed adjacent a memory cell. In some embodiments, the spacer is a second spacer formed adjacent a memory cell. In some embodiments, the memory cell comprises a metal tunneling junction (MTJ). The diagnostic determination may establish whether spacer coverage is too great or too little. In some embodiments, an additional etch process is selectively performed based on the diagnostic determination. In some embodiments, an additional deposition process is selectively performed based on the diagnostic determination.

In some embodiments, the first process is a planarization process. In some embodiments, the first process includes a cleaning process that follows a planarization process. In some embodiments, the planarization process comprises chemical mechanical polishing (CMP). In some embodiments, the diagnostic determination establishes whether an electrode has been adequately exposed by CMP. In some embodiments, the electrode is a top electrodes of a memory cell. In some embodiments, the electrode is of a high-κ metal gate (HKMG) transistor. In some embodiments, the electrodes is for one or more of a bipolar junction transistor (BJT), an n-channel metal oxide semiconductor (nMOS) transistor, a p-channel metal oxide semiconductor (pMOS) transistor, fin field effect transistors (finFETS), a gate-all-around FET (GAAFET), a gate-surrounding FET, a multi-bridge channel FET (MBCFET), a nanowire FET, a nanoring FET, a nanosheet field-effect transistor (NSFET), or the like. In some embodiments, a remedial CMP process is performed selectively based on the diagnostic determination. In some embodiments, the diagnostic determination establishes whether an excessive amount of conductive residue is present on the substrate. In some embodiments, an additional etch or clean process is performed selectively based on the diagnostic determination.

Some aspects of the present teachings relate to an integrated circuit device manufacturing system that includes a first processing tool, a second processing tool, a substrate handling system, a scanning probe microscope, and a computer processor. The scanning probe microscope receives and scans substrates that have been processed in the first processing tool. The computer processor receives data from the scanning probe microscope and issues instructions to the substrate handling system on the basis of the data. The substrate handling system may be positioned upstream from the second processing tool and may selectively deliver substrates to the second processing tool according to the instructions from the computer processor. In some embodiments, some substrates that are not immediately delivered to the second processing tool are redirected for remedial processing. In some embodiments, some substrates that are not delivered to the second processing tool are redirected for disposal or recycling.

FIG. 1 illustrates a manufacturing system 100 according to some aspects of the present teachings. The manufacturing system 100 includes a substrate handler 107, a scanning probe microscope 113, a computer processor 101, and one or more processing tools such as a first tool 109, a second tool 111, a third tool 115, and a fourth tool 119. The substrate handler 107 may receive substrates 105 from a loading system 103 and selectively move them to any of the first tool 109, the second tool 111, the third tool 115, the fourth tool 119, and the scanning probe microscope 113. The substrate handler 107 may receive instructions from the computer processor 101. The computer processor 101 may receive data from the scanning probe microscope 113.

The processing tools such as the first tool 109, the second tool 111, the third tool 115, and the fourth tool 119 can each be any of the processing tools used in the integrated circuit manufacturing industry. Examples of processing tools used in the integrated circuit manufacturing industry include, without limitation, sputtering tools, vapor deposition tools (including tools for chemical vapor deposition, atomic layer deposition, and plasma enhanced deposition), plasma etching tools, lithography tools, wet chemical processing tools, polishing tools, ion beam etching systems, furnaces, and the like.

Figure 2:
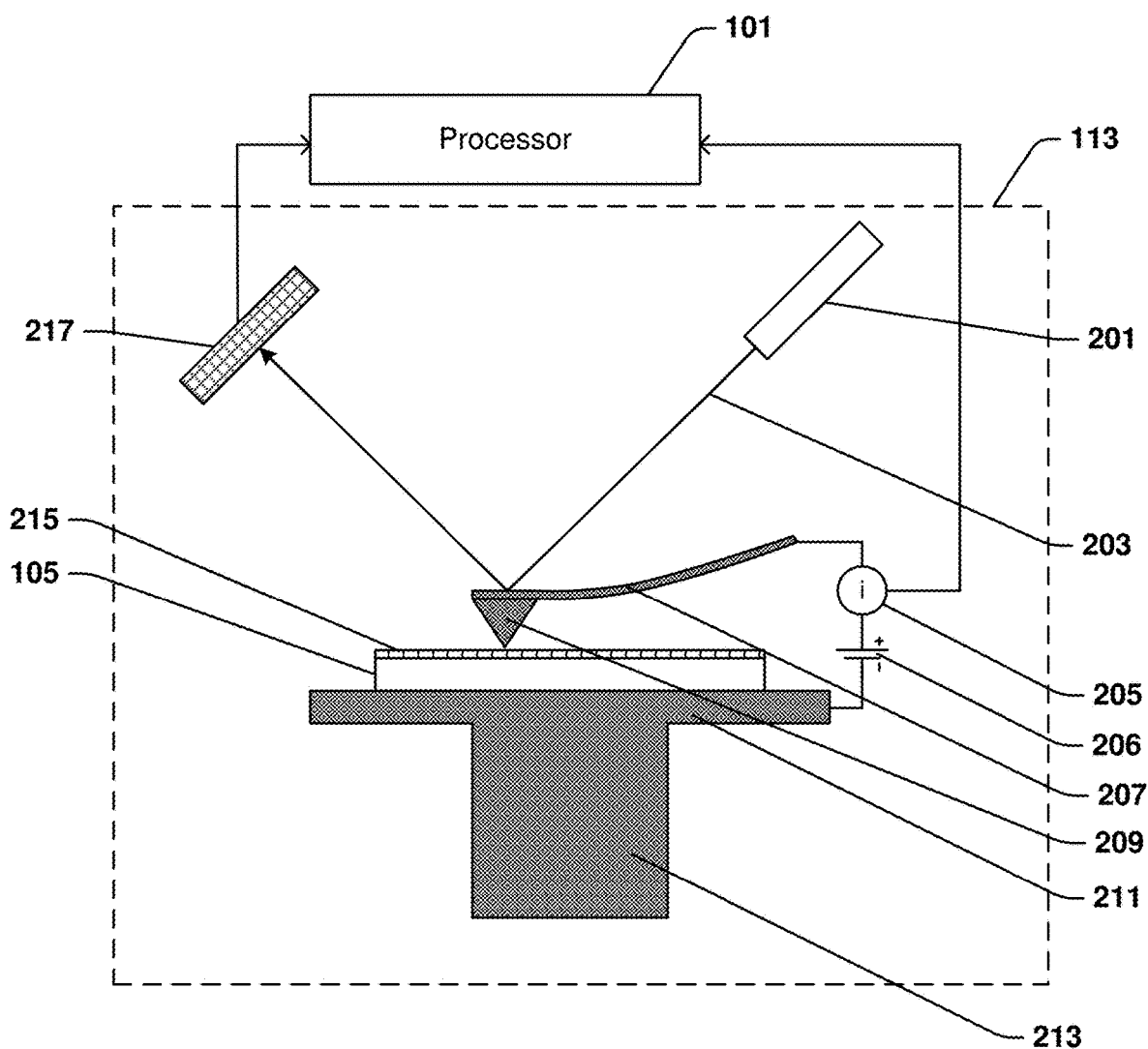
FIG. 2 illustrates a scanning probe microscope that may be used in accordance with the present teachings.

As illustrated by FIG. 2, the scanning probe microscope 113 may be a conductive atomic force microscope (C-AFM). The scanning probe microscope 113 includes a cantilever 207 having a tip 209 positioned to scan a surface 215 of a substrate 105 on a stage 211 of a table 213. The table 213 may comprise an XY or XYZ positioning stage. The stage 211 moves the substrate 105 under the tip 209, whereby the tip 209 travels across the surface 215. Alternative, the tip 209 may be configured to more while the stage 211 remains stationary. A power source 206 is operative to maintain a voltage difference between the stage 211 and the substrate 105. An amp meter 205 measures a current between the tip 209 and surface 215. The current data may be conveyed to the computer processor 101 or an intermediary processing device.

The scanning probe microscope 113 may further include a system for measuring deflection of the cantilever 207 such as a photodiode 217 configured to detect light 203 reflected off the cantilever 207 by the laser 201 and configured to measure deflection of the cantilever 207. The photodiode 217 may convey its data to the computer processor 101 or the intermediary device. Accordingly, the scanning probe microscope 113 is also an atomic force microscope (AFM) that measures variations in height across the surface 215.

Although the scanning probe microscope 113 has been illustrated as a C-AFM, the scanning probe microscope 113 may be any type of scanning probe microscope. Alternatively or in addition to being a C-AFM, the scanning probe microscope 113 may be on or more of an atomic force microscope (AFM), a chemical force microscope (CFM), an electrostatic force microscope (EFM), a Kelvin probe force microscope (KPFM), a magnetic force microscope (MFM), a piezo-response force microscope (PFM), a photothermal microscope, a scanning capacitance microscope (SCM), a scanning gate microscope (SGM), a scanning voltage microscope (SVM), a scanning tunneling microscope (STM), or the like. The scanning probe microscope 113 may have a contacting mode of operation, a non-contacting mode of operation, or both contacting and non-contacting modes of operation. The scanning probe microscope 113 has been illustrated as applying a voltage to the substrate 105 through the stage 211. Alternatively, the voltage may be applied directly to the surface 215 of the substrate 105.

The substrate 105 may include one or more semiconductor, conductor, and/or insulator structures. In some embodiments, the substrate 105 is in the form of a wafer such as a semiconductor wafer. A semiconductor may be an elementary semiconductor such as silicon or germanium with a crystalline, polycrystalline, amorphous, and/or other suitable structure; a compound semiconductor such as silicon carbide, gallium arsenic, gallium phosphide, indium phosphide, indium arsenide, indium antimonide, or the like; an alloy semiconductor such as SiGe, GaAsP, AlInAs, AlGaAs, GaInAs, GaInP, GaInAsP or the like; or a combination thereof. Combinations of semiconductors may take the form of a mixture or gradient such as a substrate in which the ratio of Si and Ge vary across locations. The substrate 105 may include a layered semiconductor. A layered semiconductor may include a semiconductor layer on an insulator such as that used to produce a silicon-on-insulator ("SOI") substrate, a silicon-on-sapphire substrate, or a silicon-germanium-on-insulator substrate, or a layer of semiconductor on glass such as that used to produce a thin film transistor ("TFT"). The manner of coupling the voltage to the substrate 105 may be selected according to the substrate type.

In some embodiments, the surface 215 of the substrate 105 includes at least one material that is conductive, at least one material that is insulating, and optionally other materials. Devices including one or more of these materials may be formed or partially formed on or over the substrate 105. In some embodiments, the substrate 105 is undergoing front-end-of-line processing (FEOL) and the devices are in or immediately above the substrate 105. In some embodiments, the substrate 105 is undergoing back-end-of-line processing (BEOL) and the devices are being formed within a metal interconnect structure above the substrate 105. In some embodiments, the devices include at least one electrode. In some embodiments, the electrodes are metal. The some embodiments, the devices are memory cells. In some embodiments, the devices are transistors. Other device types that may be at the surface 215 include, without limitation, diodes, photocells, resistors, capacitors, semiconductor fins, and the like. In some embodiments, the conductive material on the surface 215 forms conductive lines or vias.

FIG. 3 provides a flow chart of a method 300 that may be used with the manufacturing system 100. The method 300 begins with act 301, carrying out a first process. The first process may be a process carried out on the substrate 105 by the first tool 109. The method 300 continues with act 303, scanning probe microscopy to inspect a surface 215 of the substrate 105. Act 303 provides data such as height data or conductivity data. The substrate handler 107 may transfer the substrate 105 from the first tool 109 to the scanning probe microscope 113 for the scanning.

The method 300 continues with act 307, performing an analysis of data from the scanning probe microscopy and using the results to make a diagnostic determination. While the evaluation is taking place, the method 300 may simultaneously continue with an optional act 305, applying an interim process. The interim process may be a process carried out on the substrate 105 by the second tool 111. The substrate handler 107 may transfer the substrate 105 from the scanning probe microscope 113 to the second tool 111 for this interim processing.

The method 300 continues with act 309, determining whether to carry out a remedial process based on the diagnostic determination. In some embodiments, the diagnostic determination is expressed in terms of a score and act 309 determined whether that score exceeds a threshold value. In some embodiments, the score relates to a degree of uniformity of devices on the substrate 105. For example, the score may be based on conductance ranges and correlate with a uniformity in threshold voltages. In some embodiments, the score relates to a degree of conformity of devices on the substrate 105 to a specification. For example, the score may relate to a percentage of devices on the substrate 105 that have a leakage path with conductivity above a predetermined threshold. In some embodiments, the diagnostic determination provides a particular indication if a threshold condition has been met.

If act 309 determines that remediation is appropriate the method 300 may continue with act 311, which is carrying out a remedial process. The remedial process may be a process carried out on the substrate 105 by the third tool 115. The substrate handler 107 may transfer the substrate 105 from the scanning probe microscope 113 or from the second tool 111 for this remedial processing. If act 309 determines that remediation is not appropriate or if the remediation of act 311 is complete, the method 300 may continue with act 313, which is carrying out the subsequent process. The subsequent process may be a process carried out on the substrate 105 by the fourth tool 119. The substrate handler 107 may transfer the substrate 105 from the scanning probe microscope 113, from the second tool 111, or from the third tool 115 to the fourth tool 119 for the subsequent process to be carried out.

In some embodiments, the first process is ion beam etching. In some embodiments, the first process is a wet clean that follows the ion beam etching. In some embodiments the wet clean is an interim process. FIG. 4 illustrates a cross section 401 of a substrate 105A that includes memory cells 402 immediately following ion beam etching. The memory cells 402 may include a top electrode 403, a magnetic tunneling junction (MTJ) 405, and a bottom electrode 407. The top electrode 403 and the bottom electrode 407 are metal and are conductive. The bottom electrodes 407 may be coupled by vias 411 to conductive lines or vias 417 in an underlying metal interconnect layer 419, wherein the conductive lines or vias 417 are separated from one another by a dielectric material 423, which may be a low-κ dielectric. A barrier layer 415, such as tantalum nitride or titanium nitride, as well as one or more etch stop layers 421, such as a silicon nitride layer, may also be present. The metal interconnect layer 419 may be the third, the fourth, the fifth, or some of other metal interconnect layer within a metal interconnect structure of the substrate 105A. A surface 215A of the substrate 105A at this stage of processing includes the memory cells 402 and a dielectric layer 413. The MTJ 405 may include a lower ferromagnetic layer 405a and an upper ferromagnetic layer 405c, which are separated from one another by an insulator layer 405b. In some embodiments, the insulator layer 405b is a tunnel barrier and may be sufficiently thin to allow carriers to tunnel between the lower ferromagnetic layer 405a and the upper ferromagnetic layer 405c.

In some embodiments, the surface 215A is scanned using C-AFM. Although the topographical variation appears to be distinctive, it has been found the C-AFM has less noise and provides more reliable diagnostic determinations than AFM for this application. In some embodiments, a diagnostic determination identifies residues or a particle on the surface 215A and the remedial process includes further cleaning. In some embodiments, a diagnostic determination identifies excessive conductivity on a sidewall 420 of a memory cell 402 or a like location, the excessive conductivity being of a type that may be caused by redeposition of conductive material, and the remedial process includes etching adapted to remove redeposited conductive material. In some embodiments, a diagnostic determination identifies a sidewall angle that is too shallow and the remedial process includes additional etching to steepen the sidewall angle. In some embodiments, the diagnostic determination indicates the desirability of scrapping or recycling the substrate 105A.

Figure 6:
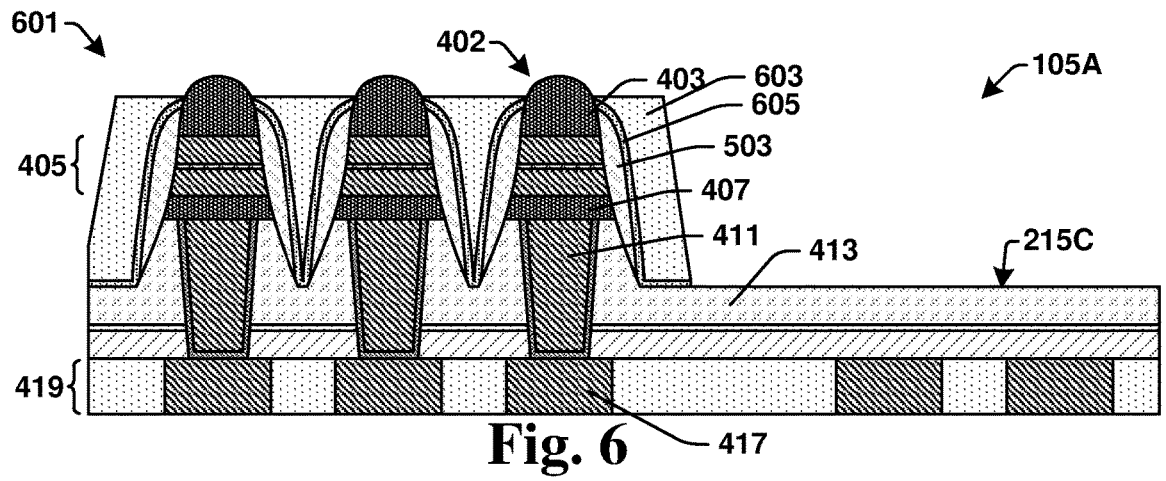

In some embodiments, the first process is a spacer etch. In some embodiments, the first process is a wet clean that follows the spacer etch. In some embodiments the wet clean is an interim process. In some embodiments, the spacer etch is a first spacer etch. FIG. 5 illustrates a cross section 501 of the substrate 105A immediately following a first spacer etch. At this stage of processing, a surface 215B of the substrate 105A includes an exposed portion of the top electrodes 403, spacers 503, which are insulators, and the dielectric layer 413. In some embodiments, the spacer etch is a second spacer etch that forms a second spacer over a first spacer. FIG. 6 illustrates a cross section 601 of the substrate 105A immediately following a second spacer etch. The second spacers 603 are formed over the spacers 503 and may be separated from the spacers 503 by a liner layer 605. At this stage of processing, a surface 215C of the substrate 105A includes an exposed portion of the top electrodes 403, second spacers 603, which are dielectric, and the dielectric layer 413.

The surface 215B or the surface 215C may be scanned using AFM, C-AFM, or both AFM and C-AFM. C-AFM may be particularly effective for determining an extent to which the top electrodes 403 have been exposed. The diagnostic determination may indicate whether the spacer etch has underexposed or overexposed the top electrodes 403. In some embodiments, a remedial process includes additional etching. In some embodiments, a remedial process includes an additional deposition of spacer material, which may be followed by an additional etch process.

Figure 7:
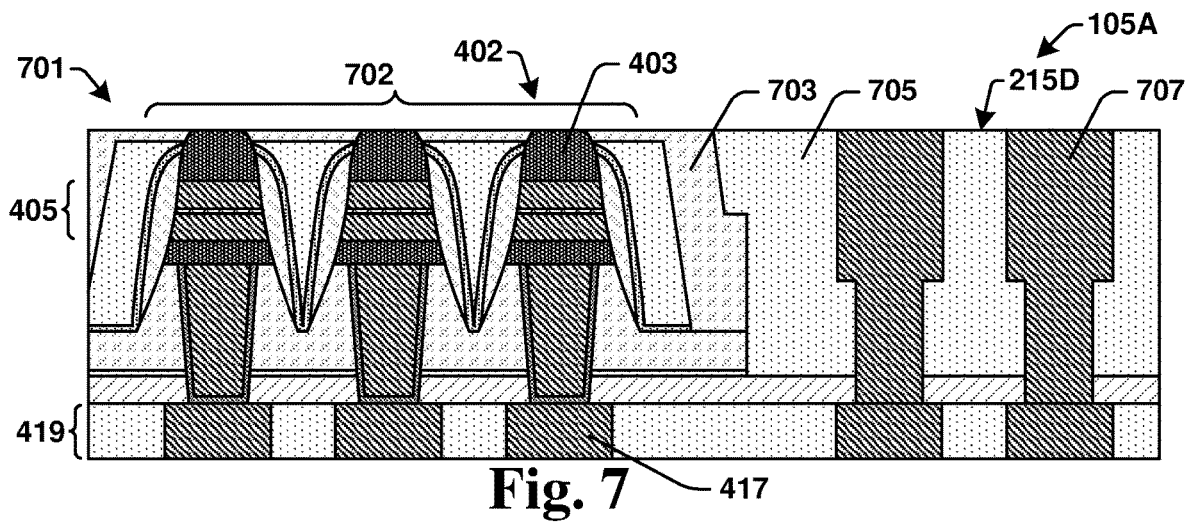

In some embodiments, the first process is a polishing process such as chemical mechanical polishing (CMP). In some embodiments, the first process is a wet clean that follows the CMP. In some embodiments the wet clean is an interim process. In some embodiments, the CMP process exposes top electrodes of memory cells. FIG. 7 illustrates a cross-sectional view 701 of the substrate 105A immediately following CMP. At this stage of processing, a surface 215D of the substrate 105A includes an exposed portion of the top electrodes 403, spacers 503, which are insulators, the dielectric layer 413, a dielectric etch stop or CMP stop layer 703, interlevel dielectric 705, and conductive plugs 707. The interlevel dielectric 705 may be a low-κ dielectric or an extremely low-κ dielectric. The surface 215D may be scanned using AFM, C-AFM, or both AFM and C-AFM. C-AFM may be particularly effective for determining an extent to which the top electrodes 403 have been exposed. The diagnostic determination may determine if CMP has underexposed or overexposed the top electrodes 403. In some embodiments, a remedial process includes additional CMP. In some embodiments, a remedial process includes an additional deposition of dielectric, which may be followed by an additional CMP process.

Figure 8:
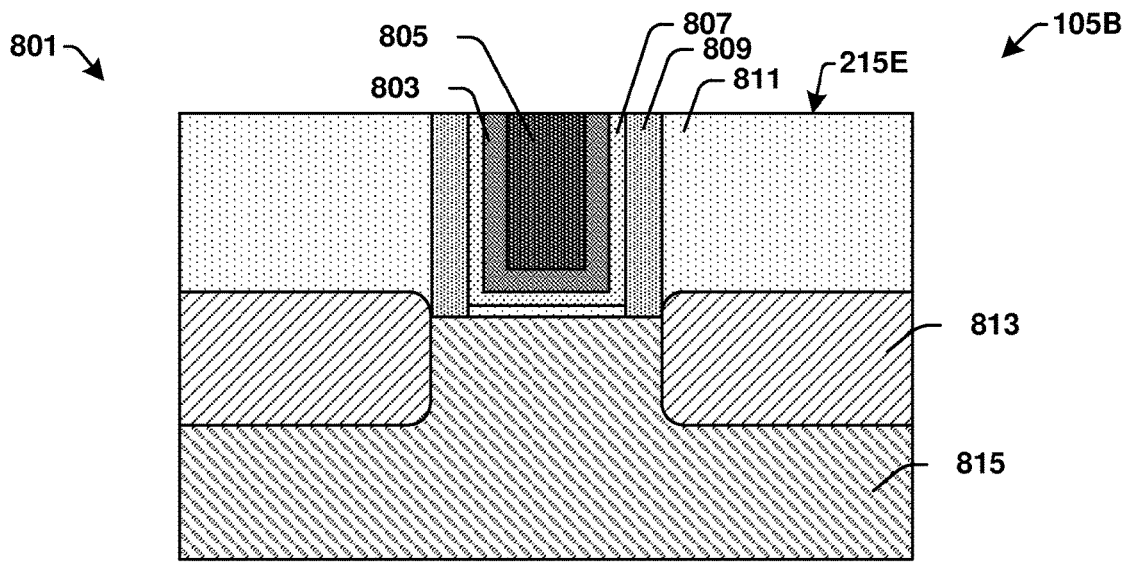
FIG. 8 illustrates a cross section of an integrated circuit at an intermediate stage of manufacturing.

In some embodiments, the CMP process exposes top electrodes of transistor gates. FIG. 8 illustrates a cross section 801 of a substrate 105B that includes a first metal gate layer 803 and a second metal gate layer 805 that together provide a metal gate electrode over a semiconductor fin 815. The structure is shown immediately following a CMP that removes excess metal from the surface 215E. In addition to the first metal gate layer 803 and the second metal gate layer 805, the surface 215E exposes a high-κ dielectric layer 807, spacers 809, and dielectric fill 811. The high-κ dielectric layer 807, the first metal gate layer 803, and the second metal gate layer 805 may wrap around the semiconductor fin 815 and source/drain regions 813 may be formed on the semiconductor fin 815 to provide a transistor structure. The surface 215E may be scanned using AFM or C-AFM. C-AFM may be particularly effective for determining an extent to which metal residues are present on the surface 215E. A remedial process may include additional CMP.

Figure 9:
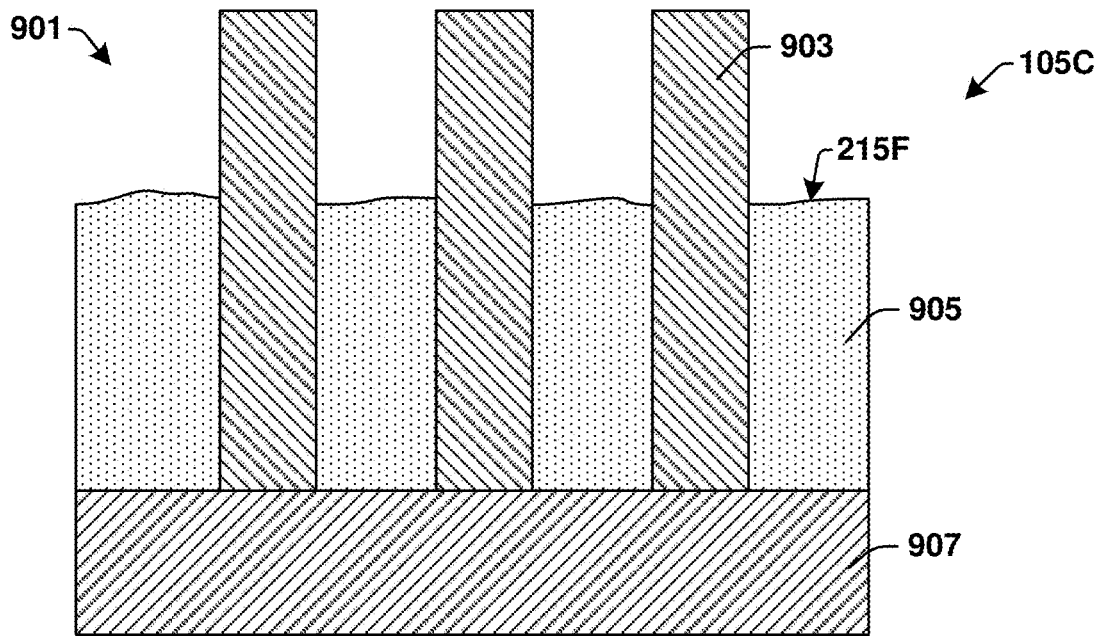
FIG. 9 illustrates a cross section of another integrated circuit at an intermediate stage of manufacturing.

In some embodiments, the first process is an etch process that recesses a dielectric adjacent semiconductor fins. FIG. 9 illustrates a cross section 901 of a substrate 105C immediately after a plasma etching process that causes a dielectric 905 to be recessed adjacent semiconductor fins 903. The semiconductor fins 903 may have been grown from a bulk semiconductor 907 within trenches that were formed in the dielectric 905. The surface 215F may be scanned using AFM or C-AFM. AFM may be effective for determining a depth to which the dielectric 215G has been recessed. C-AFM may provide an additional advantage by distinguishing between the dielectric 905 and the semiconductor fins 903. The diagnostic determination may determine if the semiconductor fins 903 have been formed properly or whether the dielectric 905 has been recessed to the correct depth. In some embodiments, a remedial process includes additional etching to further recess the dielectric 905. In some embodiments, a remedial process includes redeposition and etching of the dielectric 905. In some embodiments, a remedial process includes polishing away and regrowing the semiconductor fins 903.

C-AFM may be particularly effective for distinguishing between dielectrics, semiconductors, and metal structures on a surface. Examples of dielectrics include, without limitation, silicon oxide ($SiO_2$), silicon nitride (SiN), silicon carbide (SiC), silicon carbonitride (SiCN), silicon oxycarbide (SiOC), silicon oxycarbonitiride (SiOCN), low-κ dielectrics, extremely low-κ dielectrics, and the like. A low-k dielectric is a material having a smaller dielectric constant than $SiO_2$. $SiO_2$ has a dielectric constant of about 3.9. Examples of low-k dielectrics include, without limitation, organosilicate glasses (OSG) such as carbon-doped silicon dioxide, fluorine-doped silicon dioxide (FSG), organic polymer low-k dielectrics, porous silicate glass, and the like. An extremely low-k dielectric is a material having a dielectric constant of about 2.1 or less. An extremely low-k dielectric may be a low-k dielectric with additional porosity. A high-k dielectric is a material having a smaller dielectric constant than $SiO_2$. A high-κ dielectric may be a metal oxide or a silicate of hafnium (Hf), aluminum (Al), zirconium (Zr), lanthanum (La), magnesium (Mg), barium (Ba), titanium (Ti), lead (Pb), or the like. Examples of high-κ dielectrics include, without limitation, titanium oxide ($TiO_2$), hafnium zirconium oxide (HfZrO), tantalum oxide ($Ta_2O_3$), hafnium silicon oxide ($HfSiO_4$), hafnium oxide ($HfO_2$), zirconium oxide ($ZrO_2$), zirconium silicon ($ZrSiO_2$), and the like. Examples of conductive metals include, without limitation, tantalum, titanium, platinum, gold, iridium, tungsten, nickel, ruthenium, copper, nitrides thereof, silicides thereof, alloys thereof, and the like.

In some embodiments, scanning surveys only a portion of the substrate surface. In some embodiments, the portion of the surface that is surveyed is $10^{-6}$ percent or less a total area of the surface. In some embodiments, the portion of the surface that is surveyed is $10^{-8}$ percent or less a total area of the surface. In some embodiments, the portion of the surface that is surveyed is from 0.01 to 100 $\mu m^2$. In some embodiments, the portion of the surface that is surveyed is from 0.1 to 10 $\mu m^2$. The area surveyed may be one more distinct zones on the surface. In some embodiments, the area surveyed comprises two or more disjoint zones on the surface. In some embodiments, the substrate is a wafer and a first zone is closer to a center of the wafer than a second zone. This type of zone selections may be beneficial after a process such as CMP, which may proceed at a different rate near the edge of a wafer as compared to its center. Each zone that is scanned may include a plurality of rows and columns representing discrete data points. In some embodiments, each zone includes from 10 to $10^5$ rows and from 10 to $10^5$ columns. In some embodiments, each zone includes from $10^2$ to $10^4$ rows and from $10^2$ to $10^4$ columns.

In some embodiments, the zone scanned is varied from substrate to substrate relative to the geometry of the substrate. For example, one wafer may be scanned in a zone nearer the center and the next wafer scanned in a zone nearer the edge. In some embodiments, the area to be scanned is varied in a predetermined manner. In some embodiments, the area to be scanned is varied randomly. These strategies may increase the probability that a problem occurring in only one area of a substrate is detected before it affects a large number of substrates.

In some embodiments, each zone that is scanned includes a plurality of instances of one type of device. For example, the area scanned may be a portion of a memory cell array and include a plurality of memory cells. In some embodiments, the number of devices scanned is between 2 and $10^4$. In some embodiments, the number of devices scanned is between 5 and $10^3$. In some embodiments, the number of devices scanned is between 10 and 500. For a fixed number of measurement points, varying a spacing between measurement points provides a tradeoff between the number of devices included in the survey and the precision with which each device is scanned. In some embodiments, the vertical and horizontal spacings between measurement points are in the range from 0.1 nm to 100 nm. In some embodiments, the vertical and horizontal spacings between measurement points are in the range from 0.2 nm to 10 nm. In some embodiments, the vertical and horizontal spacings between measurement points are in the range from 0.5 nm to 1 nm.

Figure 10:
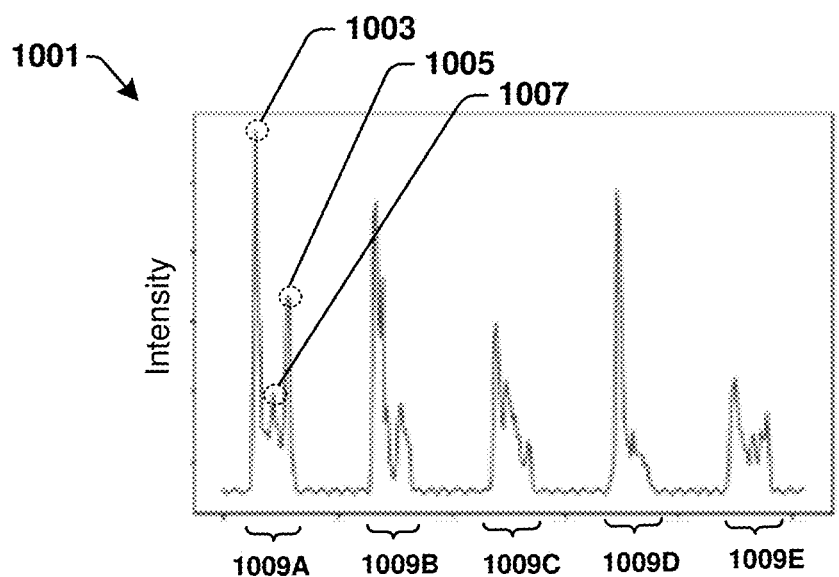
FIG. 10 is a plot off C-AFM data obtained in accordance with some aspects of the present teachings.

FIG. 10 provides a plot 1001 of one row of data from a C-AFM scan of the memory array 702 of the substrate 105A illustrated by the cross-sectional view 701 of FIG. 7. FIG. 10 includes sets of peaks 1009A-1009E, each of which represents a distinct memory cell 402. A diagnostic determination as to whether a manufacturing issue is present may be made according to whether any of the peak values is above or below a threshold value or whether a particular pattern is present in the data. For example, the group of peaks 1009A includes a first peak 1003, a middle peak 1007, and a third peak 1005. The middle peak 1007 is lower than the first peak 1003 and the third peak 1005. This structure may indicate there is a leakage path at an edge of the memory cell 402 that corresponds to the group of peaks 1009A.

Figure 11:
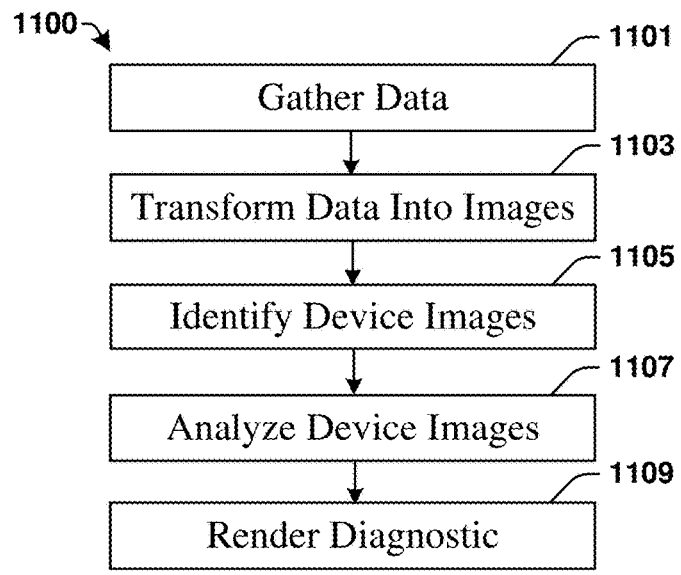
FIG. 11 is a flow chart of a method according to some aspects of the present teachings.
Figure 12:
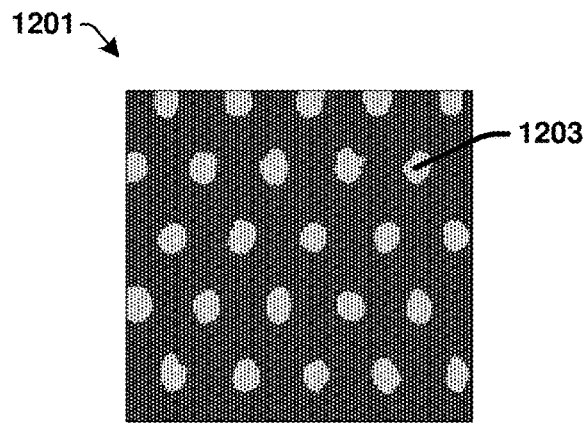
FIG. 12 is an image of data obtained in accordance with some aspects of the present teachings.

FIG. 11 provides a flow chart of a method 1100 that may be used to processing the data that is collected by scanning probe microscopy. The method 1100 begins with act 1101, which is gathering the data. Act 1103 is forming the data into an image. FIG. 12 provides an example. FIG. 12 shows an image 1201 that represents all the data from the C-AFM scan of the memory array 702 of the substrate 105A illustrated by the cross-sectional view 701 of FIG. 7 as a grey-scale image. In some embodiments, a plurality of images are formed due to there being a plurality of data types. Transforming the data may include operations such as filtering, averaging, scaling, and interpolating. The results may be stored as arrays of pixels, each pixel having a value representing a measurement value at a particular (X, Y) coordinate. If there are multiple data types, e.g., topography and conductance data, it is desirable that the images corresponding to these different data types each have the same number pixels with values for corresponding coordinates.

The method 1100 may continue with act 1105, identifying portions of the data images that correspond to individual devices. In the image 1201, these portions are device images 1203, which correspond to distinct memory cells 402. The art of image processing provides algorithms adapted to this purpose. These algorithms may be referred to as "blob detection" or "interest point detection" methods. Once identified, the device images 1203 may be analyzed, which is act 1107, and the analysis used to make a diagnostic determination, which is act 1109. In some embodiments, corresponding areas of a second image representing another data type are analyzed to make the diagnostic determination. For example, a C-AFM image may be used to identify the device locations and an AFM image used to evaluate device characteristics, or vice versa. In some embodiments, the diagnostic determination is made according to just the data in the portions of the data image that relate to particular devices. A diagnostic determination may relate to such matters as whether electrodes are adequately exposed, whether leakage currents are excessive, or whether trenches are adequately deep, and the like. In some embodiments a diagnostic determination relates to whether all the examined devices have an electrical property within a predetermined specification.

Figures 13A, 13B, 13C:
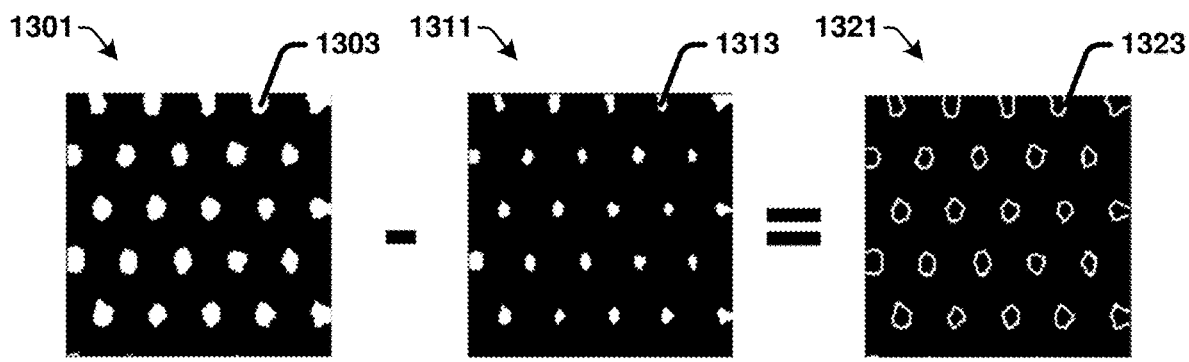
FIGS. 13A-C are black and white images derived from the image of FIG. 12 in accordance with other aspects of the present teachings.

In some embodiments, a diagnostic determination is made based on the device shapes. For this purpose, the image may be transformed virtually or otherwise from a greyscale image to a black and white image. The transformation from the image 1201 of FIG. 12 to the image 1301 of FIG. 13A provide an example. The device images 1303 of image 1301 are formed from the device images 1203 of FIG. 1201. In some embodiments, forming the black and white device images from the greyscale device images comprises stripping one or more outer pixels from the greyscale device images. In some embodiments, an outermost region of one to ten pixels width is stripped from the grey scale image. For example, the device images 1303 lack the outermost two pixels of the device images 1203. Stripping these eccentric pixels may reduce noise in the shape data. The outermost pixels may be determined based on distance from a centroid. Alternatively, the outermost pixels may be determined based on distance from a perimeter. In some embodiments, a diagnostic determination is made according to the areas of the device images 1303.

In some embodiments, a diagnostic determination is made based on the conformation of the perimeters of the device shapes. For this purpose, the device image centers may be removed. These centers may be obtained by selecting pixels that are more than a certain number of pixels from any outer edge. For example, the image 1311 of FIG. 13B has center areas 1313 that correspond to those pixels of the device images 1303 that are five pixels or more from outside the device images 1303. Subtracting the image 1311 from the image 1301, or equivalently, subtracting the center areas 1313 from the device images 1303, provides the image 1321 of FIG. 13C, which contains device perimeters 1323. The device perimeters 1323 may be analyzed for a property such as circularity and a diagnostic determination may be made on that basis. Alternatively, or in addition, the center areas 1313 may be analyzed for a property such as circularity and a diagnostic determination may be made on that basis.

Figure 14:
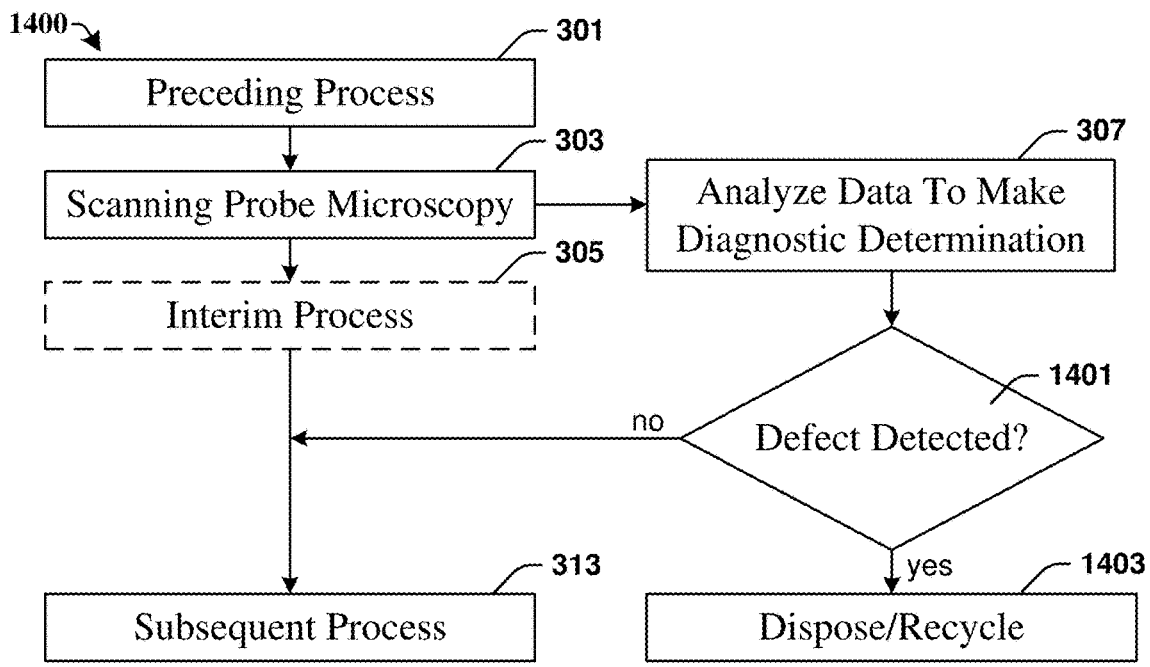
FIG. 14 is a flow chart of a method according to some other aspects of the present teachings.

FIG. 14 provides a flow chart of a method 1400 that may be used in the manufacturing system 100. The method 1400 is similar to the method 300 and contains many of the same steps. Principal differences are that method 1400 uses the diagnostic determination of act 307 in act 1401, determining if the substrate has a defect and the method 1400 has act 1403, disposing of or recycling the substrate if a defect is detected. Early detection and disposal of substrates with defects can be useful in increasing overall throughput and reducing costs associated with complete manufacturing of substrates that do not contribute to yield.

Figure 15:
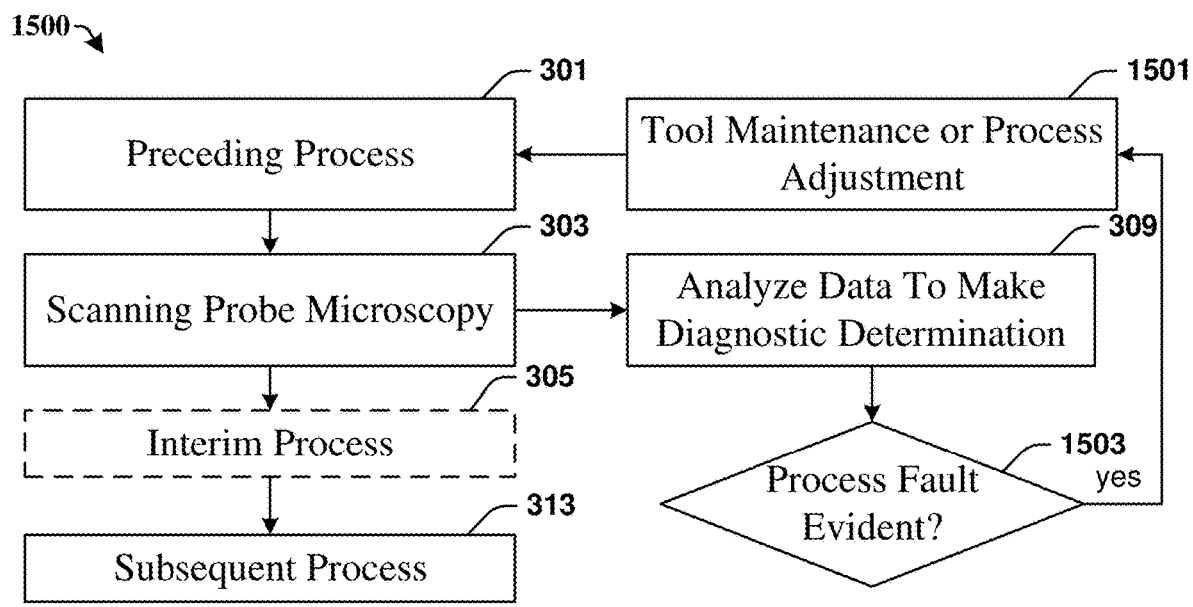
FIG. 15 is a flow chart of a method according to some other aspects of the present teachings.

FIG. 15 provides a flow chart of a method 1500 that may be used in the manufacturing system 100. The method 1500 is similar to the method 300 and contains many of the same steps. A principal difference is that method 1500 uses the diagnostic determination of act 307 in act 1503, determining if there is a fault in a process used to produce the substrate and act 1501, performing process tool maintenance or another process adjustment in response to the detections. In some embodiments a sputtering target is inspected or replaced based on the diagnostic determination. In some embodiments an edge ring or other consumable part in a plasma chamber is inspected or replaced based on the diagnostic determination. In some embodiments, a tool is cleaned based on the diagnostic determination.

While the method 300 of FIG. 3, the method 1400 of FIG. 14, and the method 1500 of FIG. 15 have been illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

Some aspects of the present teachings relate to a method that includes applying a first manufacturing process to a substrate having a surface, scanning a portion of the surface using a scanning probe microscope to obtain data, processing the data to make a diagnostic determination, and selectively applying a second manufacturing process to the substrate based on the diagnostic determination.

Some aspects of the present teachings relate to a method that includes receiving a substrate having a plurality of device structures, scanning a portion of the substrate using a scanning probe microscope to obtain data, forming one or more images from the data, identifying areas of the one or more images that correspond to individual devices among the plurality of device structures, applying an analysis to the areas that correspond to individual devices, and using a result of the analysis in a manufacturing process or system.

Some aspects of the present teachings relate to as integrated circuit device manufacturing system that includes a first processing tool, a second processing tool, a substrate handling system, a scanning probe microscope, and a computer processor. The scanning probe microscope receives substrates from the first processing tool. The computer processor receives data from the scanning probe microscope. The substrate handling system selectively delivers substrates to the first manufacturing processing tool according to instructions from the computer processor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
applying a first manufacturing process to a substrate having a surface;
scanning a portion of the surface using a scanning probe microscope to obtain data;
forming a first image from the data, identifying a plurality of individual device images within the first image, and analyzing shapes of perimeters of the individual device images to make a diagnostic determination;

selectively applying a second manufacturing process to the substrate based on the diagnostic determination; and applying a third manufacturing process to the substrate while processing the data to make the diagnostic determination, wherein the third manufacturing process comprises a wet clean;

wherein the scanning probe microscope measures variations in height across the portion of the surface and the data relates to the variations in height.

2. The method of claim 1, wherein analyzing the shapes of the perimeters of the individual device images to make the diagnostic determination comprises analyzing circularity of the perimeters.

3. The method of claim 1, wherein the scanning probe microscope also measures conductance and the data further comprises conductance data.

4. The method of claim 1, wherein the first manufacturing process is an etch process, a polishing process, a wash process that immediately follows an etch process, or a wash process that immediately follows a polishing process; and
the scanning immediately follows the first manufacturing process.

5. The method of claim 1, further comprising selectively disposing or recycling substrates based on the diagnostic determination.

6. The method of claim 1, wherein the second manufacturing process is a remedial process.

7. The method of claim 1, wherein the data relates to a topography of MRAM cells.

8. The method of claim 1, wherein the data relates to a depth to which a dielectric is recessed around semiconductor fins.

9. A method, comprising,
applying a first manufacturing process to a substrate having a surface;
scanning a portion of the surface using a scanning probe microscope to obtain data, wherein the scanning probe microscope measures variations in height across the portion of the surface and the data relates to the variations in height;
processing the data to make a diagnostic determination;
selectively applying a second manufacturing process to the substrate based on the diagnostic determination; and
applying a third manufacturing process to the substrate while processing the data to make the diagnostic determination, wherein the third manufacturing process comprises a wet clean.

10. The method of claim 9, wherein the scanning probe microscope measures variations in height across the portion of the surface and the data relates to the variations in height.

11. The method of claim 9, wherein the first manufacturing process is an etch process, a polishing process, a wash process that immediately follows an etch process, or a wash process that immediately follows a polishing process; and
the scanning immediately follows the first manufacturing process.

12. The method of claim 9, wherein the scanning probe microscope is of a type that provides conductivity data.

13. The method of claim 9, wherein the diagnostic determination relates to whether spacer coverage around a memory cell is too great or too little.

14. The method of claim 9, wherein processing the data comprises forming a first image from the data; and
processing the data further comprises identify a plurality of individual device images within the first image.

15. The method of claim 14, further comprising analyzing the individual device images to make the diagnostic determination.

16. The method of claim 9, further comprising selectively disposing or recycling substrates based on the diagnostic determination.

17. The method of claim 9, wherein the second manufacturing process is a remedial process.

18. The method of claim 9, wherein the data relates to a topography of MRAM cells.

19. The method of claim 9, wherein the data relates to a depth to which a dielectric is recessed around semiconductor fins.

20. A method, comprising,
applying a first manufacturing process to a substrate having a surface;
scanning a portion of the surface using a scanning probe microscope to obtain data, wherein the scanning probe microscope measures variations in height across the portion of the surface and the data relates to the variations in height;
processing the data to make a diagnostic determination;
selectively applying a second manufacturing process to the substrate based on the diagnostic determination; and
applying a third manufacturing process to the substrate while processing the data to make the diagnostic determination, wherein the third manufacturing process comprises a wet clean;
wherein the scanning probe microscope is an atomic force microscope.

\* \* \* \* \*